US008723319B2

(12) United States Patent
Wang

(10) Patent No.: US 8,723,319 B2
(45) Date of Patent: May 13, 2014

(54) BGA PACKAGE STRUCTURE AND METHOD FOR FABRICATING THE SAME

(75) Inventor: TsingChow Wang, Shanghai (CN)

(73) Assignee: Semiconductor Manufacturing International (Beijing) Corporation, Beijing (CN)

( * ) Notice: Subject to any disclaimer, the term of this patent is extended or adjusted under 35 U.S.C. 154(b) by 107 days.

(21) Appl. No.: 13/219,371

(22) Filed: Aug. 26, 2011

(65) Prior Publication Data

US 2012/0153470 A1    Jun. 21, 2012

(30) Foreign Application Priority Data

Dec. 21, 2010 (CN) ............ 2010 1 0599209

(51) Int. Cl.
H01L 23/498 (2006.01)
H01L 21/768 (2006.01)
H01L 23/48 (2006.01)

(52) U.S. Cl.
USPC ............ 257/738; 257/737; 257/E23.068; 257/E21.589; 438/613

(58) Field of Classification Search
USPC ............ 257/738, 737, 772, 779; 438/613
See application file for complete search history.

(56) References Cited

U.S. PATENT DOCUMENTS 6,534,875 B1 * 3/2003 Nishiyama .......... 257/778
7,221,053 B2 * 5/2007 Meyer et al. .......... 257/737
7,375,431 B1 * 5/2008 Patwardhan et al. .......... 257/773
7,564,130 B1 * 7/2009 Li .......... 257/734
7,714,437 B2 * 5/2010 Naya .......... 257/737
2002/0195690 A1 * 12/2002 Fukui .......... 257/666
2004/0061220 A1 * 4/2004 Miyazaki et al. .......... 257/723
2005/0029667 A1 * 2/2005 Yamashita et al. .......... 257/772
2005/0093153 A1 * 5/2005 Liu .......... 257/738
2005/0098802 A1 * 5/2005 Kim et al. .......... 257/222
2007/0080451 A1 * 4/2007 Suh .......... 257/737

FOREIGN PATENT DOCUMENTS

CN    1848381    10/2006

* cited by examiner

Primary Examiner — Marc Armand
Assistant Examiner — Quinton Brasfield
(74) Attorney, Agent, or Firm — Anova Law Group, PLLC

(57) ABSTRACT

A BGA package structure and a method for fabricating the same, wherein the BGA package structure comprises: a substrate having a first surface used to carry a chip and a second surface opposite to the first surface, wherein the substrate is divided into several regions according to different distances from a central point of the substrate; a plurality of contact bonding pads on the second surface electrically connected with the chip; and a plurality of bumps respectively attached to each of the contact bonding pads, wherein the contact bonding pads and bumps in a region which is closest to the central point are the smallest, while the contact bonding pads and bumps in a region which is farthest to the central point are the biggest. Therefore the situation that the bumps at the edge are liable to peel off may improved.

18 Claims, 4 Drawing Sheets

BGA PACKAGE STRUCTURE AND METHOD FOR FABRICATING THE SAME

CROSS REFERENCE TO RELATED APPLICATIONS

The present application claims the priority of Chinese Patent Application No. 201010599209.6, entitled "BGA Package Structure and Method for Fabricating the Same", and filed on Dec. 21, 2010, the entire disclosure of which is incorporated herein by reference.

FIELD OF THE INVENTION

The present invention is generally related to semiconductor manufacturing technology, and especially to a Ball Grid Array (BGA) package structure and a method for fabricating the same.

BACKGROUND OF THE INVENTION

With the continuous development in integrated circuit technology, electronic products are increasingly developing in a direction of miniaturization, intellectualization, high-performance and high-reliability. Integrated circuit (IC) package not only has direct influence on the performance of integrated circuit, electronic module and even the whole machine, but also restricts the miniaturization of the whole electronic system, the low-cost and reliability.

Under these circumstances, electronic industry has made higher and higher requirements on IC package technology. Therefore, integrated circuit fabrication is miniaturized, which causes a rise in logic circuits contained in the chips, and increases the number of chip input/output (I/O) pin. To meet the demands, many different methods for package come into being, such as Ball Grid Array (BGA), Chip Scale Package (CSP), Multi Chip Module package (MCM package), Flip Chip Package, Tape Carrier Package (TCP), Wafer Level Package (WLP), etc.

Nowadays, the BGA package technology is becoming very popular in advanced integrated circuit package. The BGA package technology is a surface mount package that utilizes an array of ball bumps on the back of the substrate to replace traditional leads, which provides semiconductor devices with high level integration and excellent performance. The BGA package technology significantly increases the number of I/O pins of semiconductor devices and reduces the pitch between the pads, which makes the packaged devices have smaller size and save the space occupied by the packaged devices, and thus makes the miniaturization of semiconductor devices with high density, high performance and multi-pin such as PC chipset and microprocessor become possible.

Bump formation technology is a key technology in BGA. Usually the breakdown of BGA is caused by the failure of bumps, so the reliability of the bumps is the main factor to be solved in the development of BGA package technology. In the prior art, solder deposits on a piece of chip metal bedding through some certain technological processes. Bumps are the metal solder balls formed after reflowing under certain temperature.

With the increasing integration of semiconductor devices, distances between bumps decrease rapidly. Bumps at the edge are liable to peel off because the edges of the chip are far from the central point, and in conditions of periodic variation of temperature, the stress on the bumps at the edge is greater than that closer to the central point. In order to maintain the mechanical intensity of a bump, volume of the bump needs to be enlarged. However, due to the mutual soluble physical property of metals, increasing volume of all bumps in limited area will make the bumps become larger and turn to a lateral move. This may cause bridging between bumps, then lead to further short-circuit, and finally influence the electrical property of semiconductor devices.

SUMMARY OF THE INVENTION

Embodiments of the present invention provide a BGA package structure and a method for fabricating the same to prevent peeling-off of bumps and bridging between bumps.

In one embodiment, a BGA package structure includes: a substrate having a first surface used to carry a chip and a second surface opposite to the first surface; a plurality of contact bonding pads on the second surface electrically connected with the chip; and a plurality of bumps respectively attached to each of the contact bonding pads. The substrate is divided into several regions according to different distances from a central point of the substrate. The contact bonding pads and bumps in a region which is closest to the central point of the substrate are the smallest, while the contact bonding pads and bumps in a region which is farthest to the central point of the substrate are the biggest.

In another embodiment, a method for fabricating a BGA structure includes: providing a substrate having a first surface used to carry a chip and a second surface opposite to the first surface; dividing the substrate into several regions according to different distances from a central point of the substrate; forming a plurality of contact bonding pads on the second surface electrically connected with the chip and are separated by an insulating layer, wherein critical dimensions of the contact bonding pads in a region which is closest to the central point of the substrate are the smallest, while critical dimensions of the contact bonding pads in a region which is farthest to the central point of the substrate are the largest; and forming bumps on the contact bonding pads, wherein dimensions of the bumps in a region which is closest to the central point of the substrate are the smallest, while dimensions of the bumps in a region which is farthest to the central point of the substrate are the largest.

Compared with the prior art, the present invention has the following advantages. The chip is divided into several regions according to different distances from the central point on the substrate. The bumps at a region which is closest to the central point of the substrate are the smallest. The farther the bumps are from the central point, the bigger the bumps are. That the bumps at the edge of the chip turn to be the biggest enhance the adhesion between the bumps and the contact bonding pads at the edge, and effectively improves the situation that the bumps at the edge are liable to peel off. In addition, the devices in the central region of the substrate are comparatively centralized, and the bumps are the smallest. Thus short-circuit caused by bridging between bumps will not happen. At the edge, amounts of the bumps will be appropriately reduced because the devices are comparatively thin, and bridging will not happen if the bumps are enlarged.

DETAILED DESCRIPTION OF THE EMBODIMENTS

As one of IC package technology, BGA package technology brings higher level of integration and better performance to semiconductor devices. BGA package technology forms a plurality of solder bumps on a surface of a substrate which connect a chip with the substrate, thereby reducing the package size, meeting the demands of high-performance of electronic products (such as high speed, high frequency and smaller pins) and making the products have excellent electronic and heat-transfer properties.

However, the inventor found out that with the increasing integration of the semiconductor devices, distances between the bumps decrease rapidly. The bumps at the edge are liable to peel off because the edge of the substrate is far from the central point, and in conditions of periodic variation of temperature, the stress on the bumps at the edge is greater than the stress on the bumps closer to the central point of the substrate. In order to maintain the mechanical intensity of a bump, volume of the bump needs to be enlarged. However, due to the mutual soluble physical property of metals, increasing volume of all bumps in limited area will make the bumps become larger and turn to a lateral move. This may cause bridging between the bumps, and then lead to further short-circuit.

Considering the technical problems, based on the experiments, the inventor divided the substrate into several regions according to different distances from the central point on the semiconductor substrate. The bumps which are closest to the central point of the substrate have the smallest sizes. And the farther the bumps are from the central point, the bigger the bumps are. That the bumps at the edge of the chip are the largest biggest enhances the adhesion between the bumps and the contact bonding pads at the edge, and effectively improves the situation that the bumps at the edge are liable to peel off. In addition, the devices in the central region of the substrate are comparatively centralized, and the bumps are the smallest. Thus short-circuit caused by bridging between bumps will not happen. At the edge, amounts of the bumps will be appropriately reduced because the devices are comparatively thin, and bridging will not happen if the bumps are enlarged.

Figure 1:
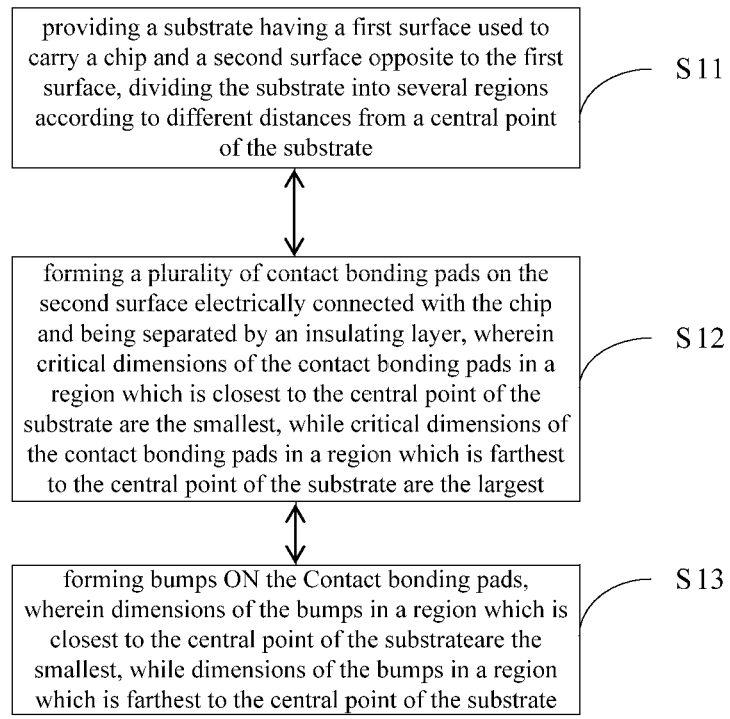
FIG. 1 shows a flow chart of a method for fabricating a BGA package structure according to an embodiment of the present invention.

A method for fabricating a BGA package structure according to an embodiment of the present invention is shown in FIG. 1. The method includes the following steps.

Step S11, providing a substrate with a first surface used to carry a chip and a second surface opposite to the first surface, dividing the substrate into several regions according to different distances form the central point of the substrate.

In the embodiment of the present invention, the substrate may be a PCB substrate or a ceramic substrate.

A chip is usually laid on the first surface of the substrate and may be connected with the first surface through metal wires or through ball bumps. Vias which extend through the first surface and the second surface are in the substrate and are filled with conductive material. The chip is connected with the BGA bumps on the second surface electrically through the conductive material in the vias, and thus the electrical connection between the chip and external devices is achieved after the chip is packaged.

Figure 2:
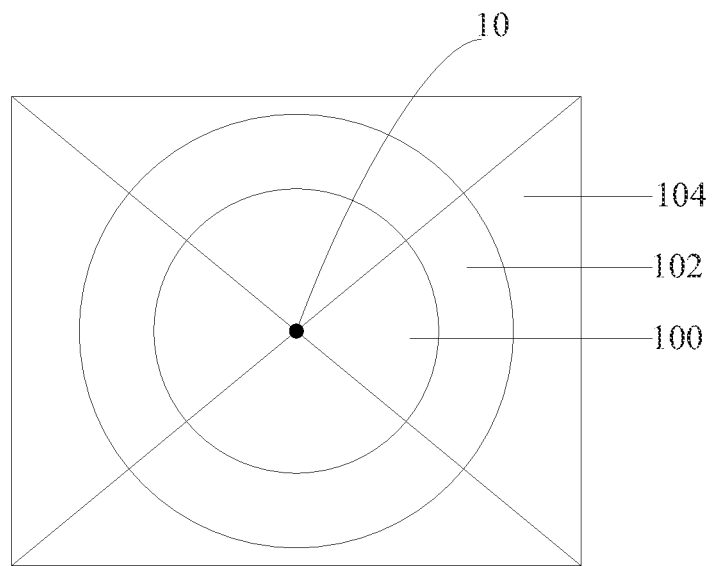
FIG. 2 shows a schematic view of the regional division on a BGA package substrate according to an embodiment of the present invention.

As a first embodiment which is shown in FIG. 2, division of regions is performed firstly according to distances from the central point. When a substrate size is about 40 mm, taking a central point 10 as a center with a radius ranging from 0 mm to 20 mm, taking this circle as a first region 100, density of the semiconductor devices in the first region 100 is the highest. Taking the central point 10 as the center with a radius ranging from 20 mm to 30 mm, taking this annulus as a second region 102, density of the semiconductor devices in the second region 102 is thinner than density of the semiconductor devices in the first region 100. The region that from edge of the second region 102 to the edge of the substrate is a third region 104, and since the third region 104 is the edge, density of the semiconductor devices is the lowest.

In a second embodiment, when a substrate size is 30 mm, taking a central point 10 as the center with a radius ranging from 0 mm to 15 mm, taking this circle as a first region 100, density of the semiconductor devices is the highest. Taking the central point 10 as the center with a radius ranging from 15 mm to 20 mm, taking this annulus as a second region 102, density of the semiconductor devices in the second region 102 is thinner than density of the semiconductor devices in the first region 100. Taking the central point 10 as the center with a radius ranging from 20 mm to 30 mm, taking this annulus as a third region 104, density of the semiconductor devices is thinner in the third region 104 than density of the semiconductor devices in the second region 102, and since it is the edge, density of the semiconductor devices is the lowest.

In addition to the above two embodiments, the division of the substrate region mainly depends on density of the semiconductor devices and the substrate area.

Step S12: forming a plurality of contact bonding pads on the second surface electrically connected with the chip and being separated by an insulating layer, wherein critical dimensions of the contact bonding pads in a region which is closest to the central point of the substrate are the smallest, while critical dimensions of the contact bonding pads in a region which is farthest to the central point of the substrate are the largest.

In the first embodiment as FIG. 2 shows, since the density of the semiconductor devices in the first region 100 is highest, accordingly the critical dimensions of the bonding pads are the smallest, ranging from about 260 μm to 290 μm. The density of the semiconductor devices in the second region 102 is thinner than the density of the semiconductor devices in the first region 100, so that the critical dimensions of the contact bonding pads in the second region 102 are accordingly increased, ranging from about 290 μm to 320 μm. In the third region 104 which is the edge area, density of the semiconductor devices is the lowest, and due to the edge effect, bumps are likely to peel off, so that the critical dimensions of the contact bonding pads in the third region 104 are increased largely enough, and meanwhile bridging will be avoided. The critical dimensions of the contact bonding pads in the third region 104 are ranging from about 320 μm to 356 μm.

In the second embodiment as FIG. 2 shows, when the substrate size reaches to 30 mm, density of the semiconductor devices in the first region 100 is highest, and accordingly the critical dimensions of the contact bonding pads are ranging from about 240 μm to 266 μm. While the density of the semiconductor devices in the annular second region 102 is thinner than the density of the semiconductor devices in the first region 100, so that the critical dimensions of the contact bonding pads in the second region 102 are accordingly increased, ranging from about 266 µm to 292 µm. In the annular third region 104 which is out of the second region 102 and is the edge, density of the semiconductor devices is the lowest, and due to the edge effect, bumps are likely to peel off, so that the critical dimensions of the contact bonding pads in the third region 104 are increased largely enough, and meanwhile bridging will be avoided. The critical dimensions of the contact bonding pads in the third region 104 are ranging from about 292 µm to 320 µm.

Step S13: forming bumps on the contact bonding pads; wherein dimensions of the bumps in a region which is closest to the central point of the substrate are the smallest, while dimensions of the bumps in a region which is farthest to the central point of the substrate are the largest.

In a third embodiment as FIG. 2 shows, when a substrate size is 40 mm, taking a central point 10 of the substrate as a center, according to different densities of semiconductor devices moving toward the edge, the substrate is divided into a first region 100, a second region 102 and a third region 104. The sizes of the contact bonding pads are changed, so are the sizes of the bumps on the contact bonding pads. The heights of the bumps in each region are consistent, ranging from about 290 µm to 310 µm, optionally about 300 µm. However, the diameters of the bumps are quite different. The diameters of the bumps formed on the contact bonding pads in the first region 100 are ranging from about 350 µm to 370 µm. The diameters of the bumps formed on the contact bonding pads in the second region 102 are ranging from about 370 µm to 390 µm. And the diameters of the bumps formed on the contact bonding pads in the third region 104 are ranging from about 390 µm to 410 µm.

In a fourth embodiment as FIG. 2 shows, when a substrate size is 30 mm, taking a central point 10 of the chip as a center, according to different densities of semiconductor devices moving toward the edge, the substrate is divided into a first region 100, a second region 102 and a third region 104. The sizes of the contact bonding pads are changed, so are the sizes of the bumps on the contact bonding pads. The heights of the bumps in each region are consistent, ranging from about 240 µm to 260 µm, optionally about 250 µm. However, the diameters of the bumps are quite different. The diameters of the bumps formed in the first region 100 are ranging from about 305 µm to 321 µm. The diameters of the bumps formed in the second region 102 are ranging from about 321 µm to 337 µm. And the diameters of the bumps formed in the third region 104 are ranging from about 337 µm to 355 µm.

The BGA package structure formed according to the above embodiments includes: a substrate with a first surface and a second surface opposite to the first surface, wherein the first surface is used to carry a chip, wherein the substrate is divided into several regions according to different distances from a central point of the substrate; a plurality of contact bonding pads on the second surface electrically connected with the chip; and a plurality of bumps respectively attached to each of the contact bonding pads, wherein the contact bonding pads and bumps in a region which is closest to the central point of the substrate are the smallest, while the contact bonding pads and bumps in a region which is farthest to the central point of the substrate are the biggest.

Hereunder, the present invention will be described in detail with reference to embodiments, in conjunction with the accompanying drawings.

Figure 3:
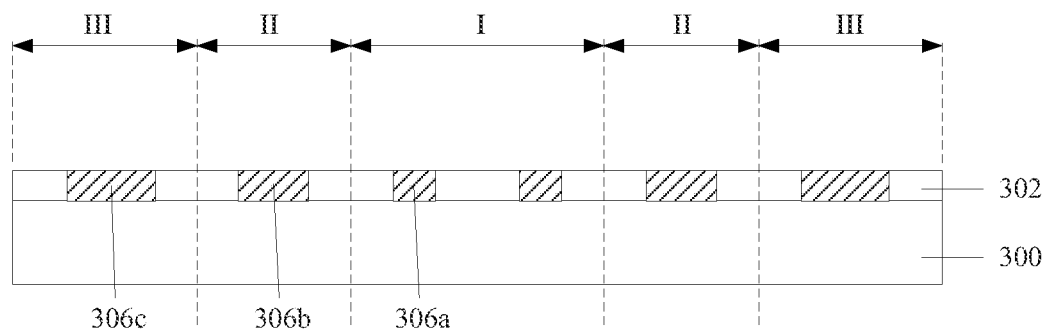
FIG. 3 to FIG. 4 show schematic cross-sectional views of intermediate structures in a method for fabricating a BGA package structure according to a first embodiment of the present invention.
Figure 4:
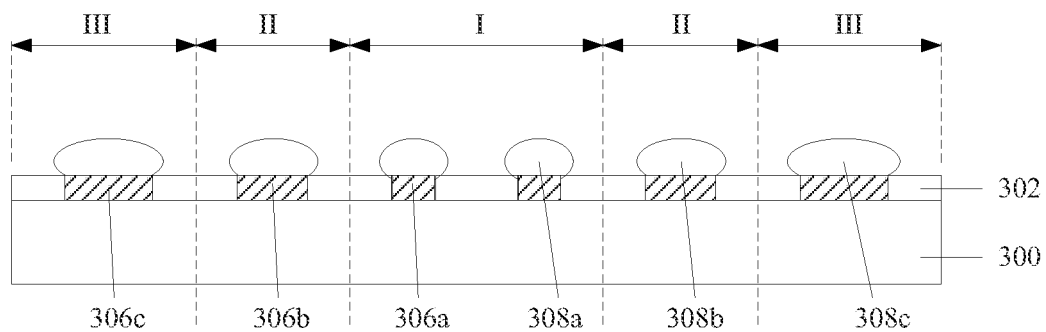

FIG. 3 to FIG. 4 show schematic cross-sectional views of intermediate structures in a method for fabricating a BGA package structure according to a fifth embodiment of the present invention. As FIG. 3 shows, taking a central point of the substrate 300 as the center, according to different dimensions and densities of the substrate 300 moving toward the edge, the substrate 300 is divided into a first region I, a second region II and a third region III. Contact bonding pads and an insulating layer 302 are formed on the substrate 300. The contact bonding pads are separated by the insulating layer 302.

The specific processes of forming the contact bonding pads and the insulating layer 302 are as follows. First, a metal layer is formed on the substrate 300, and the metal layer may be made of Cu, Sn, Pb, copper alloy, or tin-lead alloy. The metal layer has a thickness ranging from about 18 µm to 35 µm. The metal layer may be prepared by a Physical Vapor Deposition (PVD) method, patterned by the existing lithography technology and etched by etching technology, and finally the contact bonding pads 306a, 306b and 306c are formed. The contact bonding pads 306a in the first region I are the smallest. The contact bonding pads 306b in the second region II are bigger than the contact bonding pads 306a in the first region I. And the contact bonding pads 306c in the third region III are the biggest.

After that, the insulating layer 302 is formed on the substrate 300 and the contact bonding pads 306a, 306b, 306c. The insulating layer 302 may be made of ceramic, benzocyclobutene (BCB), polytetrafluoroethylene, polyimide, and the like. Then the insulating layer 302 is planarized by a chemical mechanical polishing method until surfaces of the contact bonding pads 306a, 306b and 306c are exposed. The area of the contact bonding pads 306a is the smallest, the area of the contact bonding pads 306b is larger than the area of the contact bonding pads 306a, and the area of the contact bonding pads 306c is the largest.

As FIG. 4 shows, a plurality of bumps 308a, 308b and 308c are respectively formed on the contact bonding pads 306a, 306b and 306c. The diameter of the bumps 308a in the first region I is the smallest, the diameter of the bumps 308b in the second region II is larger than the diameter of the bumps 308a in the first region I, and the diameter of the bumps 308c in the third region III is the largest.

In the embodiment, the bumps 308a, 308b and 308c may be made of codissolved tin-lead alloy, high lead tin-lead alloy, Sn—Ag alloy or Sn—Ag—Cu alloy.

Methods for forming the bumps 308a, 308b and 308c may be wire bonding or screen printing. If the bumps are formed by wire bonding, in order to form bumps in different dimensions, a stannous metal wire is made on the contact bonding pads 306a in the first region I; two stannous metal wires are made on the contact bonding pads 306b in the second region II; three stannous metal wires are made on the contact bonding pads 306c in the third region III. The exact number depends on the thickness of the stannous metal wires, the dimension of the follow-on formed bumps and distances between bumps. Take a stannous metal wire with a diameter of 30 µm for example. The diameter of the stannous metal wire formed by wire bonding is about 60 µm to 75 µm, and height of the stannous metal wire is about 50 µm to 60 µm. The superposition of two stannous metal wires makes the volume double; and the superposition of three stannous metal wires makes the volume triple.

Then, flux is coated on the stannous metal wires and the substrate 300 is put into a reflow oven, for making the stannous metal wires on the substrate 300 under heat insulation and reflow, thus forming the bumps 308a, 308b and 308c, which are of the same heights but different diameters. The diameter of the bump 308a is the smallest, the diameter of the bump 308b is larger than the diameter of the bump 308a, and the diameter of the bump 308c is the largest.

According to the above embodiment, the BGA structure includes: a substrate 300 with a first surface used to carry a chip and a second surface opposite to the first surface. Taking a central point of the substrate 300 as a center, according to different dimensions and densities of the devices moving toward the edge, the substrate 300 is divided into a first region I, a second region II and a third region III. The insulating layer 302 is on the second surface of the substrate 300. A plurality of contact bonding pads 306a, 306b and 306c, are also on the substrate 300, taking the insulating layer 302 as interval between each pair of the contact bonding pads, and the contact bonding pads 306a, 306b and 306c are substantially flush with the surface of the insulating layer 302. The contact bonding pads 306a, 306b and 306c are electrically connected with the chip via conductive plugs in the substrate 300. The contact bonding pads 306a locate in the first region I, and the area of the contact bonding pads 306a is the smallest. The contact bonding pads 306b locate in the second region II, and the area of the contact bonding pads 306b is larger than area of the contact bonding pads 306a in the first region I. The contact bonding pads 306c locate in the third region III, and the area of the contact bonding pads 306c is the largest. A plurality of bumps 308a, 308b and 308c are respectively attached to each of the contact bonding pads 306a, 306b and 306c. The diameter of the bumps 308a on the contact bonding pads 306a is the smallest, the diameter of the bumps 308c on the contact bonding pads 306c is the largest, and the diameter of the bumps 308b on the contact bonding pads 306b is in the middle.

Figure 5:
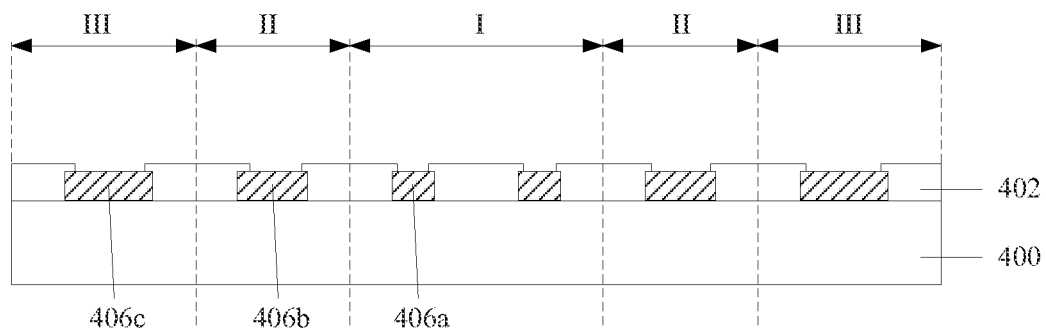
FIG. 5 to FIG. 6 show schematic cross-sectional views of intermediate structures in a method for fabricating a BGA package structure according to a second embodiment of the present invention.
Figure 6:
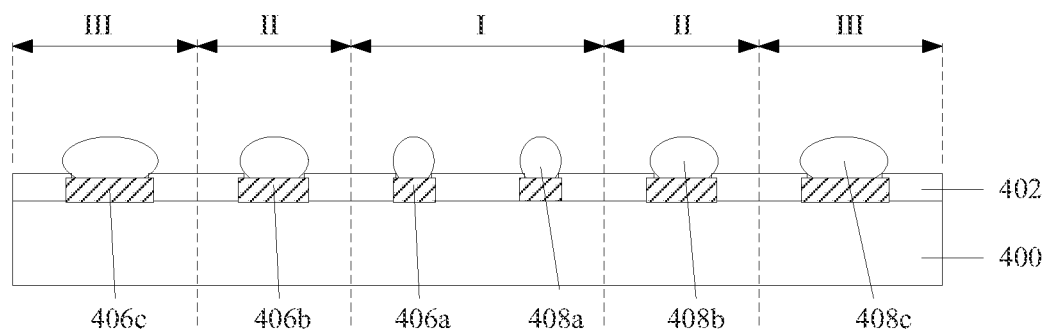

FIG. 5 to FIG. 6 show schematic cross-sectional views of intermediate structures in a method for fabricating a BGA package structure according to a sixth embodiment of the present invention. As FIG. 5 shows, a substrate 400 is provided. Taking a central point of the substrate 400 as a center, according to different dimensions and densities of the devices moving toward the edge, the substrate 400 is divided into a first region I, a second region II and a third region III. A plurality of contact bonding pads 406a, 406b and 406c and an insulating layer 402 are formed on the substrate 400, and the contact bonding pads 406a, 406b and 406c are tessellated in the insulating layer 402. The insulating layer 402 has openings, and the contact bonding pads 406a, 406b and 406c are exposed by the openings of the insulating layer 402.

The processes for forming the insulating layer 402 and the contact bonding pads 406a, 406b and 406c are well known in the art. As an embodiment of the present invention, a metal layer which may be made of Cu, Sn, Pb, copper alloy, or tin-lead alloy is formed firstly on the substrate 400. The metal layer may be prepared by a Physical Vapor Deposition (PVD) method. Then the metal layer is patterned and etched by existing lithography and etching technology so as to form the contact bonding pads 406a, 406b and 406c.

After that, the insulating layer 402 is formed on the substrate 400 and the contact bonding pads 406a, 406b, 406c. The insulating layer 402 may be made of ceramics, benzocyclobutene (BCB), polytetrafluoroethylene or polyimide. Then an opening is formed on the insulating layer 402 by using existing lithography and etching technology, and the contact bonding pads 406a, 406b and 406c are exposed by the opening. The area of the contact bonding pad 406a is the smallest, the area of the contact bonding pad 406b is larger than the area of the contact bonding pad 406a, and the area of the contact bonding pad 406c is the largest.

As FIG. 6 shows, the bumps 408a, 408b and 408c are respectively formed on each of the contact bonding pads 406a, 406b and 406c. The diameter of the bumps 408a in the first region I is the smallest, the diameter of the bumps 408b in the second region II is larger than the diameter of the bumps 408a in the first region I, and the diameter of the bumps 408c in the third region III is the largest.

The method for forming the bumps 408a, 408b and 408c is the same as that in the fifth embodiment, and will not described again.

In the embodiment, the bumps 408a, 408b and 408c may be made of codissolved tin-lead alloy, high lead tin-lead alloy, Sn—Ag alloy or Sn—Ag—Cu alloy.

According to the above embodiments, the BGA package structure includes a substrate 400 with a first surface and a second surface opposite to the first surface. Taking a central point of the substrate 400 as a center, according to different dimensions and densities of the devices moving toward the edge, the substrate 400 is divided into a first region I, a second region II and a third region III. An insulating layer 402 is formed on the second surface of the substrate 400. A plurality of contact bonding pads 406a, 406b and 406c are tessellated in the insulating layer 402. There are openings in the insulating layer 402, and the contact bonding pads 406a, 406b and 406c are exposed through the insulating layer 402. The contact bonding pads 406a, 406b and 406c are electrically connected with the conductive plugs in the substrate 400. The contact bonding pads 406a are in the first region I, whose area is the smallest; the contact bonding pads 406b are in the second region II, whose area is larger than the area of the contact bonding pads 406a in the first region I; the contact bonding pads 406c are in the third region III, whose area is the largest. A plurality of bumps 408a, 408b and 408c are respectively attached to each of the contact bonding pads 406a, 406b and 406c. The diameter of the bumps 408a on the contact bonding pad 406a is the smallest, the diameter of the bumps 408c on the contact bonding pads 406c is the largest, and the diameter of the bumps 408b on the contact bonding pads 406b is in the middle.

Although the present invention has been disclosed as above with reference to preferred embodiments thereof but will not be limited thereto. Those skilled in the art can modify and vary the embodiments without departing from the spirit and scope of the present invention. Accordingly, without departing from the scope of the present invented technology scheme, whatever simple modification and equivalent variation belong to the protection range of the present invented technology scheme.

What is claimed is:

1. A Ball Grid Array (BGA) structure, comprising:
a substrate having a first surface used to carry a chip and a second surface opposite to the first surface, wherein the substrate is divided, from a central point of the substrate, into several regions consisting of a first region, a second region, and a third region, and wherein the substrate is divided according to a density of semiconductor devices in each region of the first region, the second region, and the third region; and according to a total area of the substrate having the first region distance from the central point of the substrate for at least about 0 mm to about 15 mm;
a plurality of contact bonding pads on the second surface electrically connected with the chip; and
a plurality of bumps respectively attached to each of the contact bonding pads, wherein the plurality of bumps have a same height, and wherein the contact bonding pads and bumps in the first region at the central point and closest to the central point of the substrate have a smallest diameter, while the contact bonding pads and bumps in the third region farthest to the central point of the substrate have a biggest diameter.

2. The BGA structure according to claim 1, wherein the bumps are made of a codissolved tin-lead alloy, a high lead tin-lead alloy, a Sn—Ag alloy, or a Sn—Ag—Cu alloy.

3. The BGA structure according to claim 1, wherein when a size of the substrate is 40 mm, the first region distances from the central point ranging from 0 mm to 20 mm, the second region distances from the central point ranging from 20 mm to 30 mm, and the third region distances from the central point ranging from 30 mm to 40 mm.

4. The BGA structure according to claim 1, wherein when a size of the substrate is 30 mm, the first region distances from the central point ranging from 0 mm to 15 mm; the second region distances from the central point ranging from 15 mm to 20 mm; the third region distances from the central point ranging from 20 mm to 30 mm.

5. The BGA structure according to claim 1, wherein the contact bonding pads are made of Cu, Sn, Pb, a copper alloy, or a tin-lead alloy.

6. The BGA structure according to claim 1, wherein the bumps have heights ranging from about 290 μm to 310 μm.

7. The BGA structure according to claim 6, wherein in the first region, critical dimensions of the contact bonding pads range from about 260 μm to 290 μm, and diameters of the bumps range from about 350 μm to 370 μm; in the second region, critical dimensions of the contact bonding pads range from about 290 μm to 320 μm, and diameters of the bumps range from about 370 μm to 390 μm; in the third region, critical dimensions of the contact bonding pads range from about 320 μm to 356 μm, and diameters of the bumps range from about 390 μm to 410 μm.

8. The BGA structure according to claim 1, wherein the bumps have heights ranging from about 240 μm to 260 μm.

9. The BGA structure according to claim 8, wherein in the first region, critical dimensions of the contact bonding pads range from about 240 μm to 266 μm, and diameters of the bumps range from about 305 μm to 321 μm; in the second region, critical dimensions of the contact bonding pads range from about 260 μm to 292 μm, and diameters of the bumps range from about 321 μm to 337 μm; and in the third region, critical dimensions of the contact bonding pads range from about 292 μm to 320 μm, and diameters of the bumps range from about 337 μm to 355 μm.

10. The BGA structure according to claim 1, wherein the contact bonding pads are separated by an insulating layer.

11. The BGA structure according to claim 10, wherein the insulating layer is made of ceramics, benzocyclobutene (BCB) or polytetrafluoroethylene.

12. A method for fabricating a BGA structure, comprising:
providing a substrate having a first surface used to carry a chip and a second surface opposite to the first surface;
dividing the substrate, from a central point of the substrate, into several regions comprising a first region, a second region, and a third region, wherein the substrate is divided according to a density of semiconductor devices in each region of the first region, the second region, and the third region; and according to a total area of the substrate having the first region distance from a central point of the substrate for at least about 0 mm to about 15 mm;
forming a plurality of contact bonding pads on the second surface electrically connected with the chip and being separated by an insulating layer, wherein critical dimensions of the contact bonding pads in the first region closest to the central point of the substrate have a smallest diameter, while critical dimensions of the contact bonding pads in the third region farthest to the central point of the substrate have a largest diameter; and
forming a plurality of bumps on the contact bonding pads, wherein the plurality of bumps have a same height, and wherein dimensions of the bumps in the first region at the central point and closest to the central point of the substrate have a smallest diameter, while dimensions of the bumps in the third region farthest to the central point of the substrate have a largest diameter.

13. The method for forming the BGA structure according to claim 12, wherein the bumps are formed by wire bonding or screen printing.

14. The method for forming the BGA structure according to claim 12, wherein the bumps are made of a codissolved tin-lead alloy, a high lead tin-lead alloy, a Sn—Ag alloy, or a Sn—Ag—Cu alloy.

15. The method for forming the BGA structure according to claim 12, wherein when a size of the substrate is 40 mm, the first region distances from the central point ranging from 0 mm to 20 mm, the second region distances from the central point ranging from 20 mm to 30 mm, and the third region distances from the central point ranging from 30 mm to 40 mm.

16. The method for forming the BGA structure according to claim 12, wherein when a size of the substrate is 30 mm, the first region distances from the central point ranging from 0 mm to 15 mm; the second region distances from the central point ranging from 15 mm to 20 mm; the third region distances from the central point ranging from 20 mm to 30 mm.

17. The method for forming the BGA structure according to claim 12, wherein the insulating layer is made of ceramics, benzocyclobutene (BCB) or polytetrafluoroethylene.

18. The method for forming the BGA structure according to claim 12, wherein the density of semiconductor devices is different in the each region and decreases from the first region to the second region and further to the third region, and wherein the first region has a circle shape, the second region has an annulus shape, and the third region is between the second region and an edge of the substrate.

* * * * *